(12) United States Patent
Koepsell

(10) Patent No.: US 10,624,224 B2
(45) Date of Patent: Apr. 14, 2020

(54) DEVICE COMPRISING A MOVABLE COMPONENT

(71) Applicant: Martin Koepsell, Breckerfield (DE)

(72) Inventor: Martin Koepsell, Breckerfield (DE)

(73) Assignee: Martin Koepsell, Breckerfield (DE)

(*) Notice: Subject to any disclaimer, the term of this patent is extended or adjusted under 35 U.S.C. 154(b) by 185 days.

(21) Appl. No.: 15/122,053

(22) PCT Filed: Feb. 18, 2015

(86) PCT No.: PCT/EP2015/053377
§ 371 (c)(1),
(2) Date: Aug. 26, 2016

(87) PCT Pub. No.: WO2015/128231
PCT Pub. Date: Sep. 3, 2015

(65) Prior Publication Data
US 2017/0020015 A1    Jan. 19, 2017

(30) Foreign Application Priority Data

Feb. 28, 2014 (DE) .................... 10 2014 003 002
Jul. 28, 2014 (DE) .................... 10 2014 110 602

(51) Int. Cl.
| H05K 5/06 | (2006.01) |
| H02K 5/10 | (2006.01) |
| H01H 9/04 | (2006.01) |
| F16J 15/3284 | (2016.01) |
| F16J 15/453 | (2006.01) |
| H01H 13/06 | (2006.01) |

(52) U.S. Cl.
CPC .......... H05K 5/069 (2013.01); F16J 15/3284 (2013.01); F16J 15/453 (2013.01); H01H 9/04 (2013.01); H02K 5/10 (2013.01); H01H 13/06 (2013.01)

(58) Field of Classification Search
None
See application file for complete search history.

(56) References Cited

U.S. PATENT DOCUMENTS

| 1,764,793 A | * | 6/1930 | Johnson | .................... H02K 5/10 |
| | | | | 310/63 |
| 1,859,520 A | * | 5/1932 | Maisel | ................. F16J 15/3284 |
| | | | | 92/252 |
| 2,360,734 A | * | 10/1944 | Smith | .................. F16J 15/3284 |
| | | | | 220/378 |

(Continued)

FOREIGN PATENT DOCUMENTS

| DE | 1 178 264 | 9/1964 |
| DE | 38 23 884 A1 | 1/1990 |

(Continued)

*Primary Examiner* — Timothy J Thompson
*Assistant Examiner* — Muhammed Azam
(74) *Attorney, Agent, or Firm* — Muncy, Geissler, Olds & Lowe, P.C.

(57) ABSTRACT

A device includes an interior which is enclosed by a housing. The housing includes an opening. A movable component closes the opening in the housing between the interior and an exterior of the housing. The passage points for movable components have hydrophobic surfaces. A device of this type is protected in a non-contacting manner against penetration and discharge of fluids.

14 Claims, 8 Drawing Sheets

(56) References Cited

U.S. PATENT DOCUMENTS

| | | | | |
|---|---|---|---|---|
| 2,360,735 A * | 10/1944 | Smith | F16J 15/3284 | 220/378 |
| 2,381,914 A * | 8/1945 | Leflar | H02K 5/10 | 277/429 |
| 2,417,828 A * | 3/1947 | Joy | F16J 15/3284 | 277/437 |
| 2,781,463 A * | 2/1957 | Sprando | H02K 5/10 | 310/71 |
| 2,804,324 A * | 8/1957 | Stallings | F16J 15/3284 | 277/569 |
| 3,325,172 A * | 6/1967 | Herbold | F16J 15/3284 | 174/152 G |
| 3,387,850 A * | 6/1968 | Mastrobattista | F16J 15/3284 | 277/500 |
| 3,388,913 A * | 6/1968 | Tracy | F16J 15/36 | 277/371 |
| 3,408,084 A * | 10/1968 | Huling | F16J 15/3224 | 277/571 |
| 3,673,445 A * | 6/1972 | Rutz | F16J 15/3452 | 310/88 |
| 3,776,560 A * | 12/1973 | Wentworth, Jr. | F16J 15/363 | 277/387 |
| 3,837,660 A * | 9/1974 | Poggio | B29D 99/0053 | 264/241 |
| 3,961,799 A * | 6/1976 | Peet | F16J 15/3464 | 277/370 |
| 4,124,218 A * | 11/1978 | Wentworth, Jr. | F16J 15/022 | 277/399 |
| 4,136,887 A * | 1/1979 | Wentworth, Jr. | F16J 15/363 | 277/374 |
| 4,256,313 A * | 3/1981 | Arnold | F16J 15/3464 | 277/370 |
| 4,261,581 A * | 4/1981 | Hershey | F16J 15/363 | 277/370 |
| 4,298,778 A * | 11/1981 | Beresford-Jones | H01H 13/06 | 200/302.2 |
| 4,332,391 A * | 6/1982 | Arnold | F16J 15/3464 | 277/370 |
| 4,335,889 A * | 6/1982 | Cather, Jr. | B29C 33/40 | 277/560 |
| 4,337,954 A * | 7/1982 | Backlin | F16J 15/3232 | 277/565 |
| 4,369,979 A * | 1/1983 | Krude | F16D 3/223 | 277/635 |
| 4,384,725 A * | 5/1983 | Nenov | F16J 15/43 | 277/431 |
| 4,411,439 A * | 10/1983 | Couvillion | F16J 15/166 | 277/558 |
| 4,436,313 A * | 3/1984 | Tamama | B63H 23/321 | 277/410 |
| 4,464,593 A * | 8/1984 | Kofink | H02K 5/10 | 277/419 |
| 4,535,262 A * | 8/1985 | Newberg | H02K 5/10 | 310/88 |
| 4,556,400 A * | 12/1985 | Krude | F16D 3/84 | 277/636 |
| 4,557,491 A * | 12/1985 | Orain | F16D 3/845 | 277/636 |
| 4,606,702 A * | 8/1986 | Dinger | F04D 29/364 | 267/153 |
| 4,625,132 A * | 11/1986 | Chitayat | H02K 5/10 | 310/13 |
| 4,638,275 A * | 1/1987 | Belbel | H01H 1/66 | 218/13 |
| 4,879,443 A * | 11/1989 | Carlucci | A45D 20/12 | 200/293.1 |
| 4,946,303 A * | 8/1990 | Sawicki | F16D 3/226 | 277/634 |
| 4,949,819 A * | 8/1990 | Beutel | F16F 9/36 | 188/322.17 |
| 4,967,609 A * | 11/1990 | Takagi | F16D 3/845 | 277/636 |
| 4,981,304 A * | 1/1991 | Bice | F04D 7/08 | 277/630 |
| 4,996,613 A * | 2/1991 | Hishida | F16J 15/406 | 310/90 |
| 5,077,000 A * | 12/1991 | Bice | F04D 7/08 | 277/634 |
| 5,097,164 A * | 3/1992 | Nakasugi | F16C 33/10 | 250/231.16 |
| 5,230,660 A * | 7/1993 | Warnke | F16D 3/845 | 277/634 |
| 5,269,617 A * | 12/1993 | Urban | F16C 27/04 | 403/291 |
| 5,326,111 A * | 7/1994 | Hatch | F16J 15/3228 | 277/309 |
| 5,486,562 A * | 1/1996 | Borman | C08L 67/02 | 524/451 |
| 5,522,771 A * | 6/1996 | Poulin | F16D 3/2055 | 277/634 |
| 5,707,066 A * | 1/1998 | Sugiura | F16D 3/845 | 277/634 |
| 5,883,459 A * | 3/1999 | Cline | H01H 9/04 | 200/181 |
| 5,941,533 A * | 8/1999 | Jacobsen | A61M 5/142 | 277/551 |
| 5,961,124 A * | 10/1999 | Muller | F16J 15/40 | 277/350 |
| 6,088,531 A * | 7/2000 | Endoh | H01H 13/06 | 396/29 |
| 6,215,215 B1 * | 4/2001 | Huber | B60T 8/4022 | 310/86 |
| 6,231,048 B1 * | 5/2001 | McAnally, Jr. | F16J 15/3228 | 277/370 |
| 6,290,470 B1 * | 9/2001 | Okuno | F04B 27/1036 | 277/565 |
| 6,361,444 B1 * | 3/2002 | Cheney | F16D 3/845 | 277/636 |
| 6,921,081 B2 * | 7/2005 | Wobben | F16J 15/3208 | 277/510 |
| 7,229,356 B2 * | 6/2007 | Iwano | F16D 3/845 | 464/17 |
| 7,658,387 B2 * | 2/2010 | Park | F16J 15/3244 | 277/559 |
| 7,681,295 B2 * | 3/2010 | Lequire, Jr. | F16J 15/3276 | 277/560 |
| 7,722,052 B2 * | 5/2010 | Oida | F16J 15/3228 | 277/562 |
| 7,823,499 B2 | 11/2010 | De Volder et al. | | |
| 7,880,097 B2 * | 2/2011 | Moore | G11B 33/142 | 174/480 |
| 8,414,406 B2 * | 4/2013 | Dine | F16D 3/845 | 464/145 |
| 8,440,295 B2 * | 5/2013 | Miyazawa | F16J 15/3496 | 277/348 |
| 8,485,533 B2 * | 7/2013 | Park | C08J 3/246 | 277/551 |
| 9,121,505 B2 * | 9/2015 | Kurth | F16J 15/3284 | |
| 9,263,224 B2 * | 2/2016 | Hunt | H01J 35/101 | |
| 9,267,548 B2 * | 2/2016 | Dine | F16D 1/0876 | |
| 9,534,638 B2 * | 1/2017 | Marchand | E21B 4/003 | |
| 9,568,108 B2 * | 2/2017 | Takahashi | F16J 15/363 | |
| 9,670,963 B2 * | 6/2017 | Metzger | F16D 3/845 | |
| 9,728,879 B2 * | 8/2017 | Koepsell | B33Y 80/00 | |
| 9,780,618 B1 * | 10/2017 | Hanks | H02K 5/10 | |
| 2002/0046938 A1 * | 4/2002 | Donofrio | H01H 9/04 | 200/302.1 |
| 2002/0132674 A1 * | 9/2002 | Mohr | F16D 3/845 | 464/173 |
| 2003/0001444 A1 * | 1/2003 | Coles | F16J 15/3284 | 310/90 |
| 2003/0093086 A1 * | 5/2003 | Briggs | A61M 25/104 | 606/108 |
| 2003/0197424 A1 * | 10/2003 | Frey | H02K 5/10 | 303/3 |
| 2004/0051411 A1 * | 3/2004 | Toya | B60T 8/4022 | 310/89 |
| 2004/0188945 A1 | 9/2004 | Poincet et al. | | |

(56) References Cited

U.S. PATENT DOCUMENTS

| | | | |
|---|---|---|---|
| 2005/0012277 A1* | 1/2005 | Adrion | F16J 15/164 277/549 |
| 2005/0012416 A1* | 1/2005 | Huang | F04D 25/06 310/88 |
| 2006/0103245 A1* | 5/2006 | Simofi-Ilyes | H02K 5/10 310/58 |
| 2006/0106361 A1* | 5/2006 | Muni | A61B 5/411 604/500 |
| 2007/0085431 A1* | 4/2007 | Hayakawa | H02K 5/10 310/90 |
| 2007/0246895 A1* | 10/2007 | Pavan | F16J 15/3268 277/549 |
| 2008/0211325 A1* | 9/2008 | Rienhardt | H02K 5/10 310/43 |
| 2008/0216646 A1* | 9/2008 | Noguchi | F16J 15/3284 92/168 |
| 2008/0315145 A1* | 12/2008 | Kawamura | F16K 41/08 251/318 |
| 2010/0237167 A1* | 9/2010 | Ficyk | B05B 15/067 239/17 |
| 2011/0120073 A1* | 5/2011 | Flanary | H02K 5/08 56/250 |
| 2011/0204734 A1* | 8/2011 | Orlowski | F16J 15/4478 310/85 |
| 2011/0272896 A1* | 11/2011 | Kamibayashiyama | F16J 15/102 277/650 |
| 2012/0032542 A1* | 2/2012 | Liu | F04D 25/0613 310/88 |
| 2013/0313949 A1* | 11/2013 | Fujii | H02K 7/003 310/75 R |
| 2014/0255224 A1* | 9/2014 | Minogue | H02K 5/124 417/410.1 |
| 2016/0175022 A1* | 6/2016 | Boudreaux | A61B 18/085 606/52 |

FOREIGN PATENT DOCUMENTS

| | | | | |
|---|---|---|---|---|
| DE | 10 2010 019945 A1 | 11/2011 | | |
| EP | 1 820 771 A1 | 8/2007 | | |
| EP | 1 850 040 A1 | 10/2007 | | |
| EP | 1850040 A1 * | 10/2007 | | F16J 15/44 |
| JP | S 49-030737 A | 3/1974 | | |
| JP | H 06-043424 U | 6/1994 | | |
| JP | H 10-092253 A | 4/1998 | | |
| JP | 2009-69000 A | 4/2009 | | |
| JP | 2010-119913 A | 6/2010 | | |
| WO | WO 2010/105782 A1 | 9/2010 | | |

* cited by examiner

DEVICE COMPRISING A MOVABLE COMPONENT

BACKGROUND OF THE INVENTION

Field of the Invention

The invention relates to a device comprising a sealed interior in order to prevent penetration and/or discharge of fluids, gasses, dust, or bacteria at the points where the movable component closes an opening in the housing of the device except for an unavoidable gap for the movement of the component.

Brief Description of the Related Art

Sealing of devices against media is a general problem in technology. In a plurality of applications, a secure function of devices, motors, switches, etc., is necessary under difficult environmental conditions. Such applications are typical for the automotive, nautical, medical technology, and industrial sectors and the like. The penetration of external media into a device often interrupts the device functions. Preventing discharge of media from a device into the surroundings is likewise a typical problem. A plurality of technical solutions is known, for example, for a seal of a device housing at the passage points of stationary components as well as of movable components.

If the passage of a fixed component is to be permanently sealed under stress, then either an additional sealing element or a sealing material is used. Sealing the passage points of linearly movable and/or rotating components is particularly demanding. Contact seals at moving components are not completely leakproof and generate additional friction on movable components. Known non-contact seals prevent additional friction of this type; however, they are not completely leakproof. Another possibility for sealing is the use of barrier media. However, this type of technically leakproof sealing of devices using barrier media at the passage points of movable components generates additional friction, wherein the design expenses of such seals are also generally greater than for other types of seals. Thus, known seals for movable parts up until now either are not completely leakproof or generate additional friction.

In addition, devices in medical technology or in the food industry are to be protected from germs and toxic substances. Gaps, occurring at movable components, need to be protected against colonization by bacteria and other microorganisms. Flexible sleeves made from elastomers or films are known from the prior art for sealing these devices. Known seals are expensive to implement at complete impermeability.

Therefore, there exist a plurality of applications with the desire to functionally seal the passage points of movable components at devices with respect to external media without impairing the movement of the component.

SUMMARY OF THE INVENTION

The object of the invention is to create a simply designed seal for the passage points of movable components on a device which functions securely, is frictionless, technically leakproof, and, if necessary, antibacterial.

This problem is solved by a housing with the features of claim 1. The non-contact seal of the interior is carried out in that surface regions of the movable component and/or the housing at the passage points of the component, specifically at the openings in the housing of the device provided for these components, are designed to be hydrophobic. The linearly and/or rotationally movable components close these openings in the housing between the interior of the device and the exterior except for an unavoidable gap for the movement. The hydrophobic surfaces are arranged according to the invention parallel to the movement axis of the movable component.

In one preferred embodiment, at least one of the surfaces forming the gap, that is the component-side gap surface or the housing-side gap surface, is designed to be hydrophobic. Fluids are prevented by the changed surface tension on the hydrophobically-configured surface regions of the gap surfaces at the entry into the gap and thus also at the entry into the device or at the outlet from the device. In most cases, it is sufficient to design only one gap surface with a hydrophobic surface.

In the case of a rotating component, the same surface region of the component always delimits the gap and forms the component-side gap surface. In this type of movable component, the component-side gap surface and also the housing-side gap surface may be hydrophobic, preferably across the entire gap length. It is also sufficient in the case of longer gaps to provide partial surfaces of the gap with hydrophobic surfaces.

In the case of a linearly moving component, the surface region of the component delimiting the gap changes due to the displacement of the component in the gap. The component-side gap surface is larger than the housing-side gap surface, indeed longer by the maximum displacement path. In the case of this type of linearly movable component, hydrophobic surfaces on the component outside of the gap are therefore also advantageous, specifically preferably each surface area of the component which delimits the gap during the displacement of the component.

Due to this hydrophobic configuration of surface regions in the area of the opening, these surface regions are not wetted by fluids and thus penetration of fluids through the gap at the passage points of the movable component is prevented. As a result of the so-called Moses effect, a region above a hydrophobic surface, the cover region, may be maintained free of a fluid, whereas adjacent surface regions, which are not hydrophobically configured, may be wetted. The critical height of the fluid column, at which a cleared cover region of such a hydrophobic surface becomes wetted, depends on different factors, for example, the type of fluid (water, detergent solution, oil, among others), the material of the surfaces, if necessary, the polar fraction of the surface energy, the structure of the surfaces (e.g. nanostructure), or the coating of the surfaces (hydrophobic substances, like silicic acid based systems). Depending on the local situations, there arise different contact angles of wetting for a fluid drop on a hydrophobic surface and different levels of displacement force. Hydrophobic and superhydrophobic surfaces are often distinguished, wherein superhydrophobic surfaces are understood to have a contact angle of wetting >150°. In this description, hydrophobic and superhydrophobic are not distinguished because these limits are not clearly assigned to physical mechanisms of action. The higher the contact angle of wetting, the higher the water column, which may be held back. Contact angles of wetting from 140° to 180° are desirable for good functionality of the seals described here for the gap at movable components. In the case of simpler sealing demands, 100° may already be sufficient.

If the gap between the movable component and the housing of the device, which is protected by hydrophobic surfaces regions, is less than the critical height of the water column of the cleared cover regions of these hydrophobic surface regions, then the sealing effect is provided. The smaller the gap width, the higher the water column may be, which is held back. Gap widths of up to 0.2 mm are recommended for gaps at the passage points.

The best sealing is achieved when two gap surfaces forming a gap are configured with hydrophobic surfaces. Hydrophobic surfaces on two sides of the gap offer optimal sealing in connection with large contact angles of wetting and small gap widths. Small gap widths and large contact angles of wetting are necessary, in particular for preventing the penetration of fluids with low surface tensions. For many applications, it is sufficient if only one of the surfaces forming the gap is hydrophobic.

The seal according to the invention is based on the physical characteristics of the surfaces which form the gap. A seal may be securely implemented when the physical characteristics of the hydrophobic surfaces, the characteristics of the fluid, and the gap geometry are coordinated with one another. The sealing effect is carried out in a large range of potential gap widths. Depending on the medium, the arrangement of the hydrophobic surface regions, and the contact angle of wetting of the hydrophobic surfaces, large gap widths are also leakproof.

Providing hydrophobic surface regions on the gap surfaces is a structurally simple solution. The simple demands on the geometry result in large, reliable tolerances at the movable part or the housing and thus simple manufacturing. Such a design may be very robust, which minimizes the number of potential faults.

No additional component, i.e., no additional sealing element is necessary for the seal according to the invention, which reduces the materials used and the weight with respect to the known solutions. In one particular embodiment, however, it is also possible that at least one of the hydrophobic surfaces is located on an additional sealing element and the penetration of fluid into the gap is prevented by this means.

The sealing is carried advantageously in a non-contact way. Wear, abrasion, noise, and friction are thus prevented. Despite this, the seal is effective with respect to water and all conventional fluids, including oils, fats, solvents, salt water, water with detergent additives, etc. The sealing effect is also retained in an advantageous way below a water column.

By using an additional barrier fluid, sealing against gasses is also possible.

Sealing by means of hydrophobic surfaces is simultaneously and with no additional measures also an effective barrier for bacteria, germs, and other microorganisms, since hydrophobic surfaces may not be colonized by bacteria or microorganisms. By using an antiseptic barrier fluid, a hermetic seal is provided against gasses, fluids, dust, and germs.

The invention has the additional advantage that the gaps cleared of fluids by means of hydrophobic surfaces are also free of ice during cold treatment. Ice may not form and adhere to hydrophobic surfaces. The function of the seal may thus not be impaired by ice.

Salt also may not adhere to hydrophobic surfaces. Seals with hydrophobic surfaces are therefore particularly suitable for seawater and nautical applications.

Hydrophobic surfaces of metals are protected from corrosion. Seals, which are generated by metal parts comprising hydrophobic coatings, are protected from corrosion damage.

The non-contact seal according to the invention may also be retroactively provided in already existing structures, since no additional sealing element, no extended gap, or other structural changes are necessary. In most cases, a hydrophobization on one side, i.e. either the component-side gap surface or the housing-side gap, is already sufficient to prevent penetration of fluids through the gap. A large multiplicity of technical methods are available to generate hydrophobic surfaces, see "Superhydrophobic coating", Sandia National Laboratories 2008 R&D Award Entry Form, 2007, and "Superhydrophobic materials (ORNL)". If the hydrophobic surface is to be generated, e.g., by spraying a substrate onto a finished component, then devices originally designed without seals may be retrofitted to be sealed devices, with changes in the geometry. Some substrates form transparent hydrophobic surfaces, to that the appearance of the treated surfaces is not changed. The possibility of manufacturing plastic parts which already have hydrophobic surfaces using injection molding methods is to be emphasized, see "Superhydrophobic surfaces on complex injection molded parts", press release from the Institute for Plastics Processing at the RWTH Aachen, March, 2012.

Some embodiments of the invention are subsequently described by way of the drawings. Comparable elements are provided with identical reference numbers.

DETAILED DESCRIPTION OF THE PREFERRED EMBODIMENTS

Figure 1:
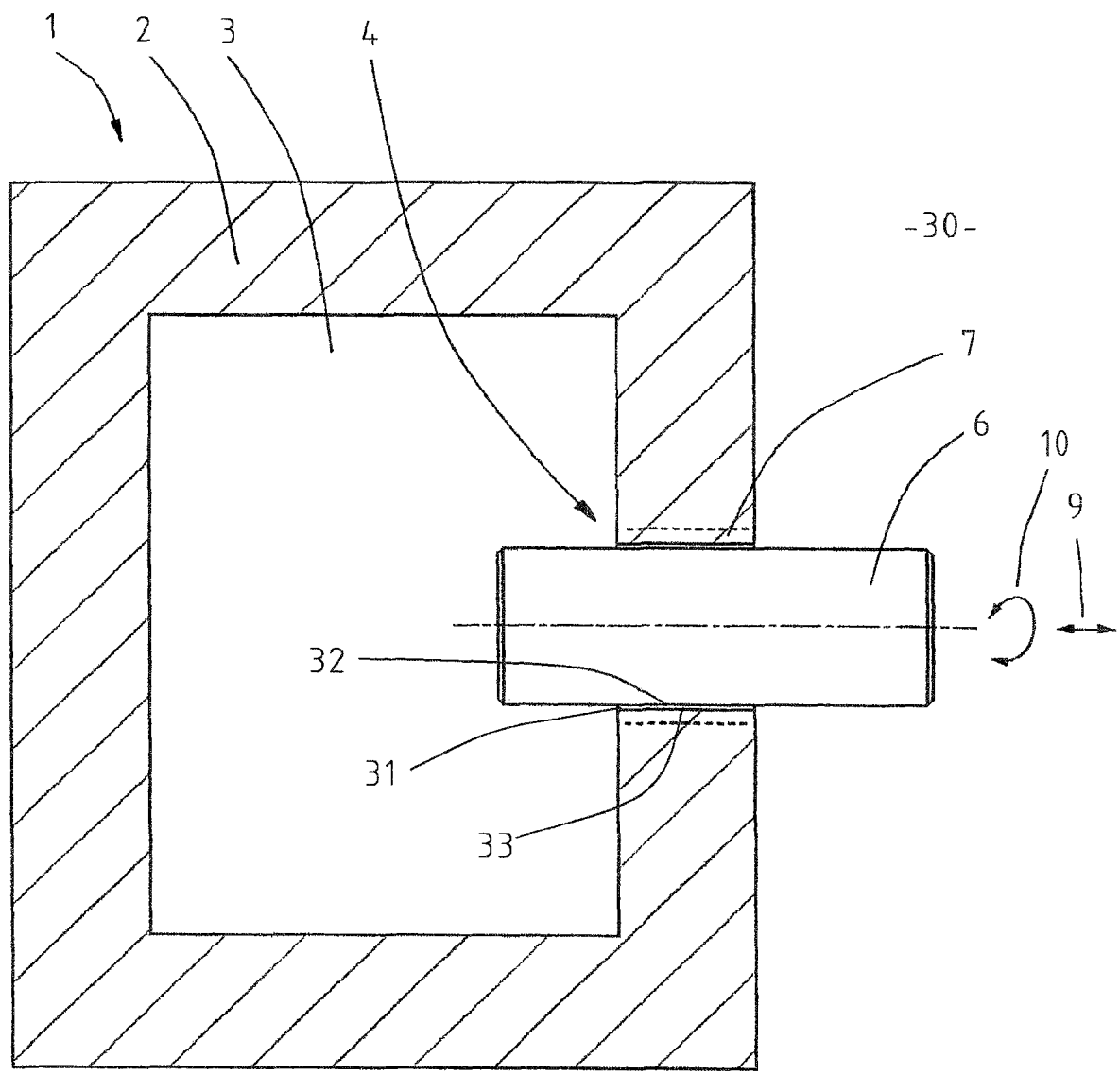
FIG. 1 illustrates a partial section of a device according to one embodiment of the present invention.

FIG. 1 shows a partial section of a device (1) according to the invention. Device (1) has an interior (3) which is enclosed by a housing (2). The housing has an opening (4) for a movable component (6). Component (6) may be moved linearly (9) and rotationally (10). Component (6) closes opening (4) except for a gap (31) necessary for the movement. Interior (3) and the exterior (30) are thus connected via gap (31). The penetration of fluids through this gap (31) is, however, not possible, since the housing-side gap surfaces (33) delimiting gap (31) have a hydrophobic surface (7), in this case a hydrophobic coating using "Hydrobead®," or "Never Wet™," or "Ever Dry®." The component-side gap surfaces (32) delimiting gap (31) may additionally or solely be hydrophobized in the same way. Gap (31) has in this case a gap width of less than 1 mm, which securely prevents penetration of water into housing (2) of device (1).

Figure 2:
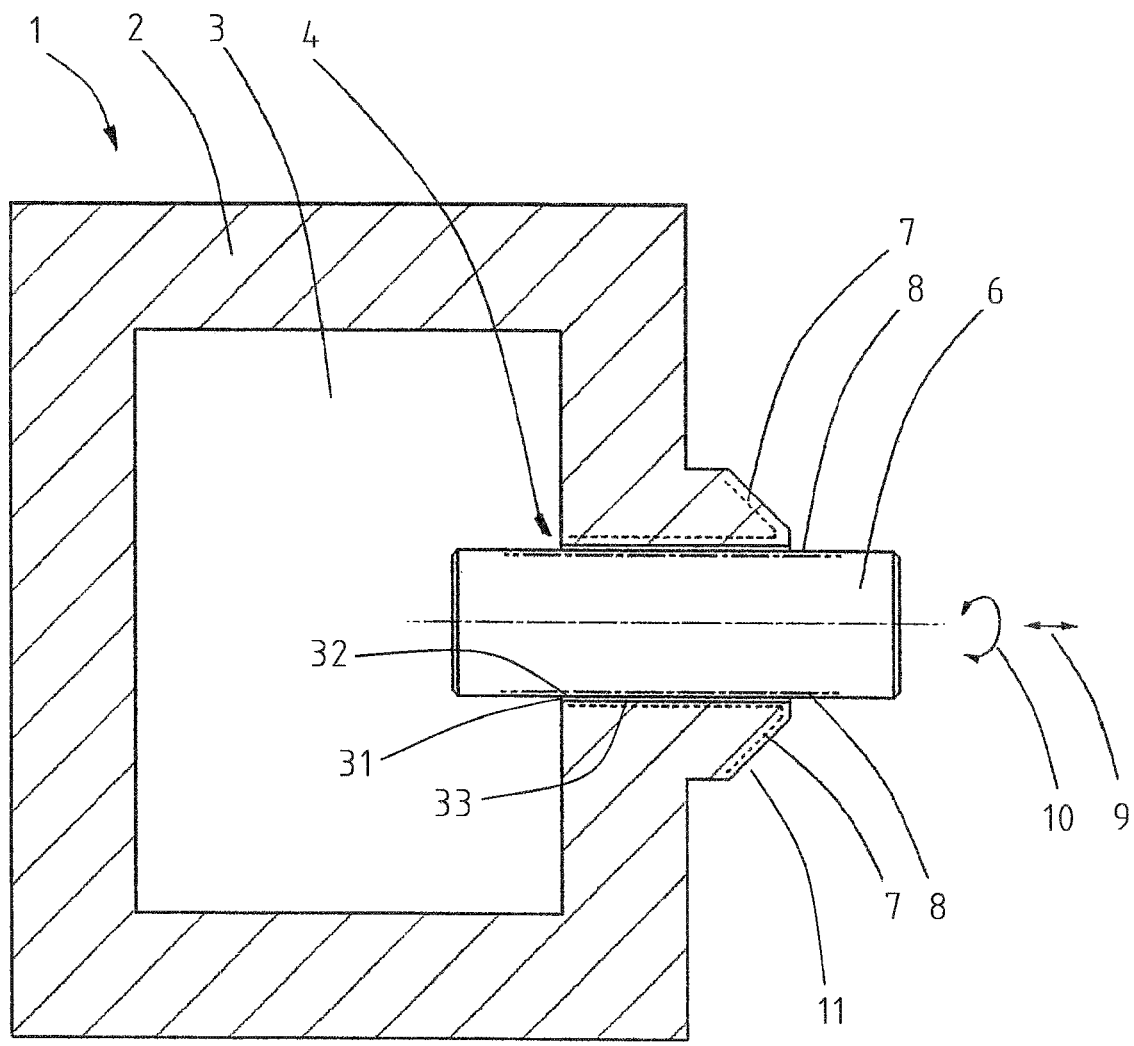
FIG. 2 illustrates a partial section of the device of FIG. 1 with a scraper.

FIG. 2 shows a partial section of a device (1) which is additionally provided with a scraper (11). Device (1) has an interior (3), which is enclosed by a housing (2) and has an opening (4) for a penetrating movable component (6). Component (6) may also be moved linearly (9) and rotationally (10) in this case. The penetration of fluids through gap (31) remaining between component (6) and housing (2) is, however, not possible, since both housing-side gap surfaces (33) delimiting gap (31) have a hydrophobic surface (7) and also component-side gap surfaces (32) delimiting gap (31) have a hydrophobic surface (8). A scraper (11) is provided on the outside of housing (2) in the region of opening (4) and is formed by a projecting conical element. The surfaces of the projecting and conical element are additionally provided with hydrophobic surfaces (7). In this way, solid media and dust are prevented from penetrating through extended gap (31) into interior (3). Outer hydrophobic surfaces (7) on scraper (11) additionally prevent an adhesion of contaminants. Contaminants of this type are transported by the movable part in the direction of scraper (11). Since the contaminants may not adhere to scraper (11), they fall down and no longer impair the movement of component (6).

Figure 3:
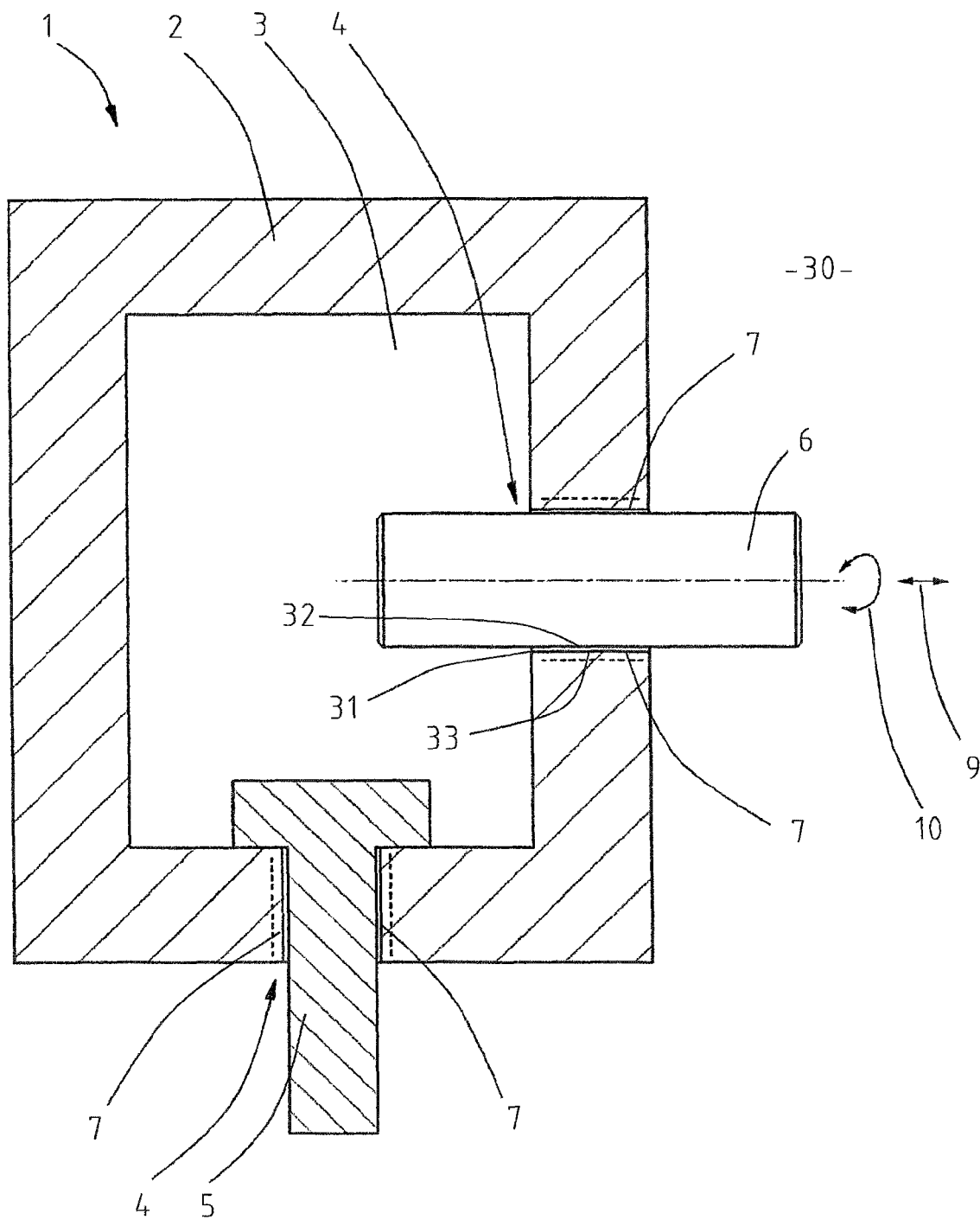
FIG. 3 illustrates a partial section of the device of FIG. 1 sealed in a non-contact way.

FIG. 3 shows a partial section of a device (1) likewise sealed in a non-contact way. Technical device (1) has an interior (3) which is enclosed by a housing (2). Housing (2) has in this case two openings (4), specifically for a penetrating fixed component (5) and for a penetrating movable component (6). Housing-side gap surfaces (33), which form gap (31) between housing (2) and components (5, 6), are provided with hydrophobic surfaces (7). Component (6) may also be moved linearly (9) and rotationally (10) in this case.

Figure 4:
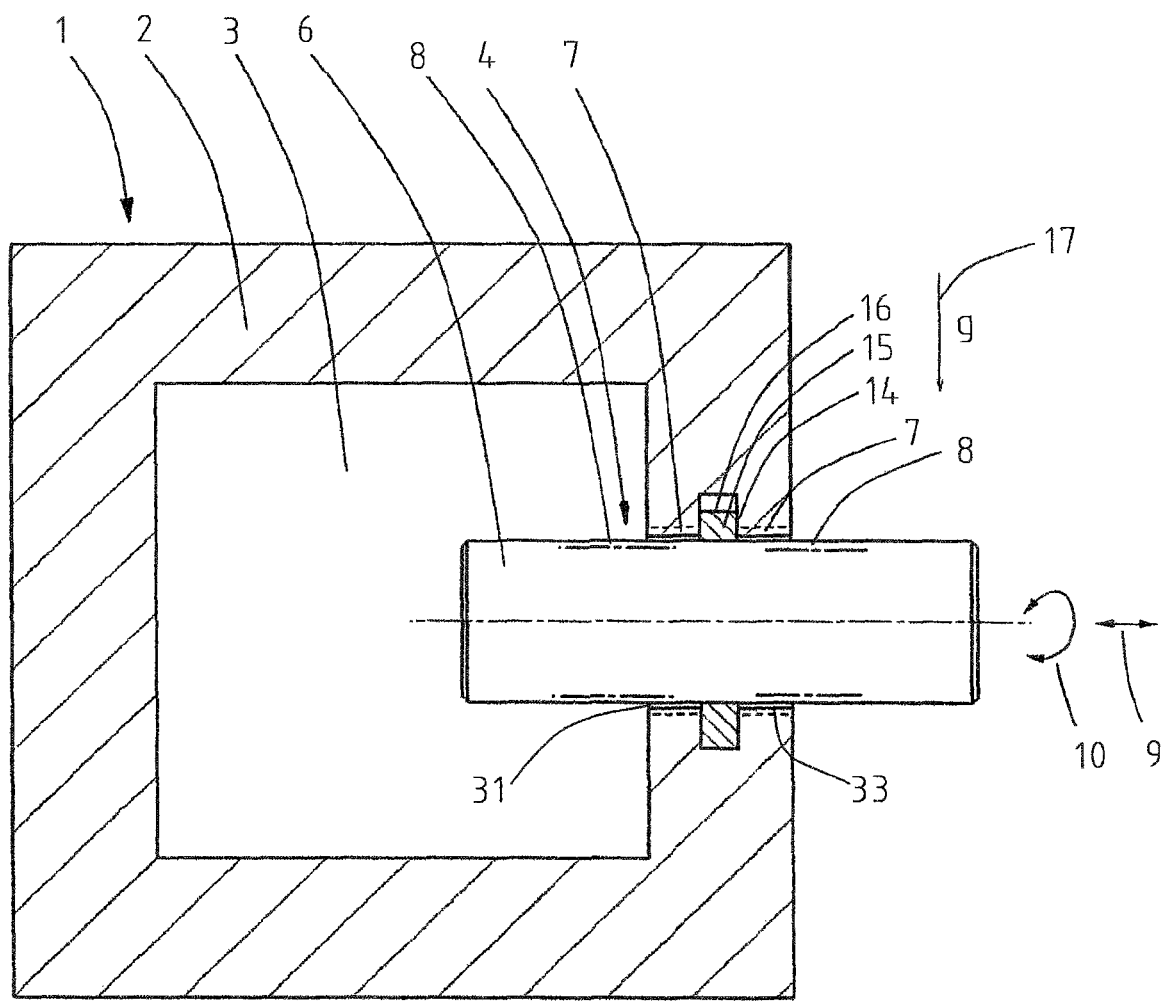
FIG. 4 illustrates another embodiment of a partial section of the device of FIG. 1 with an outwardly extending shaft as movable component.

FIG. 4 shows a partial section of a device (1) with an outwardly extending shaft as movable component (6). This shaft may also be moved linearly (9) and rotationally (10). Device (1) comprising housing (2) and interior (3) has an opening (4) through which the shaft extends outward. Housing (2) has a cavity (14) in the region of opening (4). Cavity (14) is filled with a barrier fluid (15) which forms a surface (16) as a result of the effects of centripetal force (17). Housing-side gap surfaces (33) and component-side gap surfaces (32) are provided with hydrophobic surfaces (7, 8). These hydrophobic surfaces (7, 8) are thereby arranged such that barrier fluid (15) may not leave cavity (14) and at the same time a circumferential wetting of shaft (6) is guaranteed by barrier fluid (15). Barrier medium (15) is enclosed between hydrophobic surfaces (7, 8). In conjunction with centripetal force (17), a leakproof barrier for gasses is created, as gasses may not pass barrier fluid (15). The sealing of shaft (6) is maintained during translational movements (9), during rotational movements (10), and during combined translational-rotational movements (9, 10).

Figure 5:
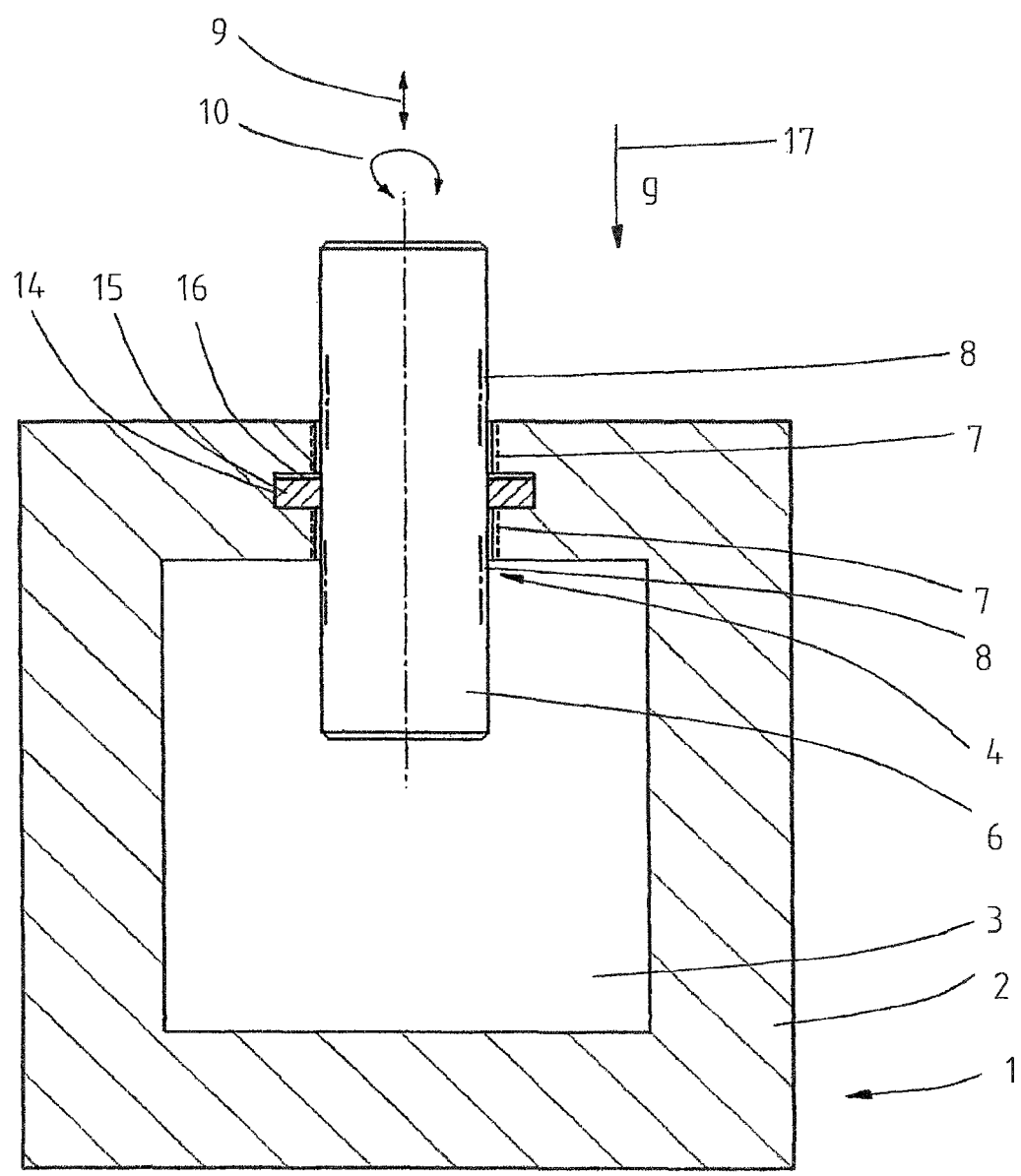
FIG. 5 illustrates yet another embodiment a partial section of the device of FIG. 1 with an outwardly extending shaft as movable component.

FIG. 5 shows the partial section of a device (1), likewise with an outwardly extending shaft as movable component (6). Unlike device (1) from FIG. 4, centripetal force (17) affects the shaft axially. As is clear, the sealing effect using barrier fluid (15) is maintained regardless of the effective direction of centripetal force (17).

Figure 6:
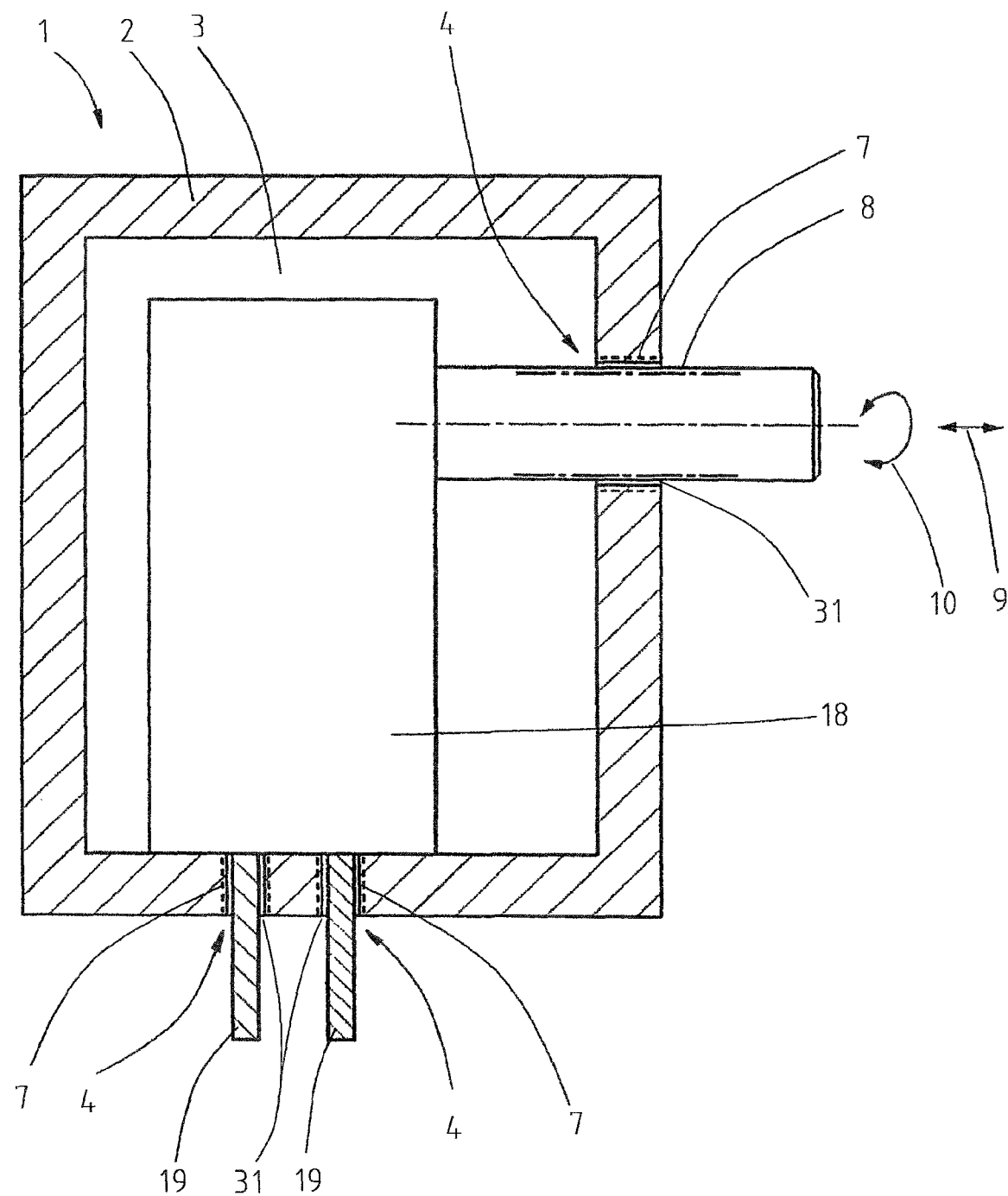
FIG. 6 illustrates a partial section of an electric switch which forms the device of FIG. 1.

FIG. 6 shows a partial section of an electric switch which in this case forms device (1). This electric switch (1) has a housing (2) comprising an interior (3). A movable component (6), which in this case is an actuating element, protrudes outward through an opening (4) in housing (2). If actuating element (6) executes translational movements (9), then it is a tappet. If actuating element (6) executes rotational movements (10), then it is a rotary actuator. Combined movements (9, 10) of actuating element (6) are also possible. Actuating element (6) functions on a switch mechanism (18) which is connected to an electrical circuit via electrical supply lines (19). Hydrophobic surfaces (7, 8) are provided in the region of opening (4) in housing (2) for actuating element (6) both on component-side gap surfaces (32) and also on housing-side gap surfaces (33). Due to the potential linear movement of actuating element (6), hydrophobic surfaces (8) on actuating element (6) are provided past the gap length. This embodiment increases the security of the seal under harsh real-world conditions. Hydrophobic surfaces (7) are only provided on housing-side gap surfaces (33) in the region of opening (4) in housing (2) for stationary electrical supply lines (19). This is sufficient for technically conventional gap widths of 0.01-0.3 mm. Hydrophobic surfaces (7, 8) prevent a wetting of the surfaces of gap surfaces (32, 33) delimiting gap (31) and thus a penetration of fluids into interior (3) of device (1).

Figure 7:
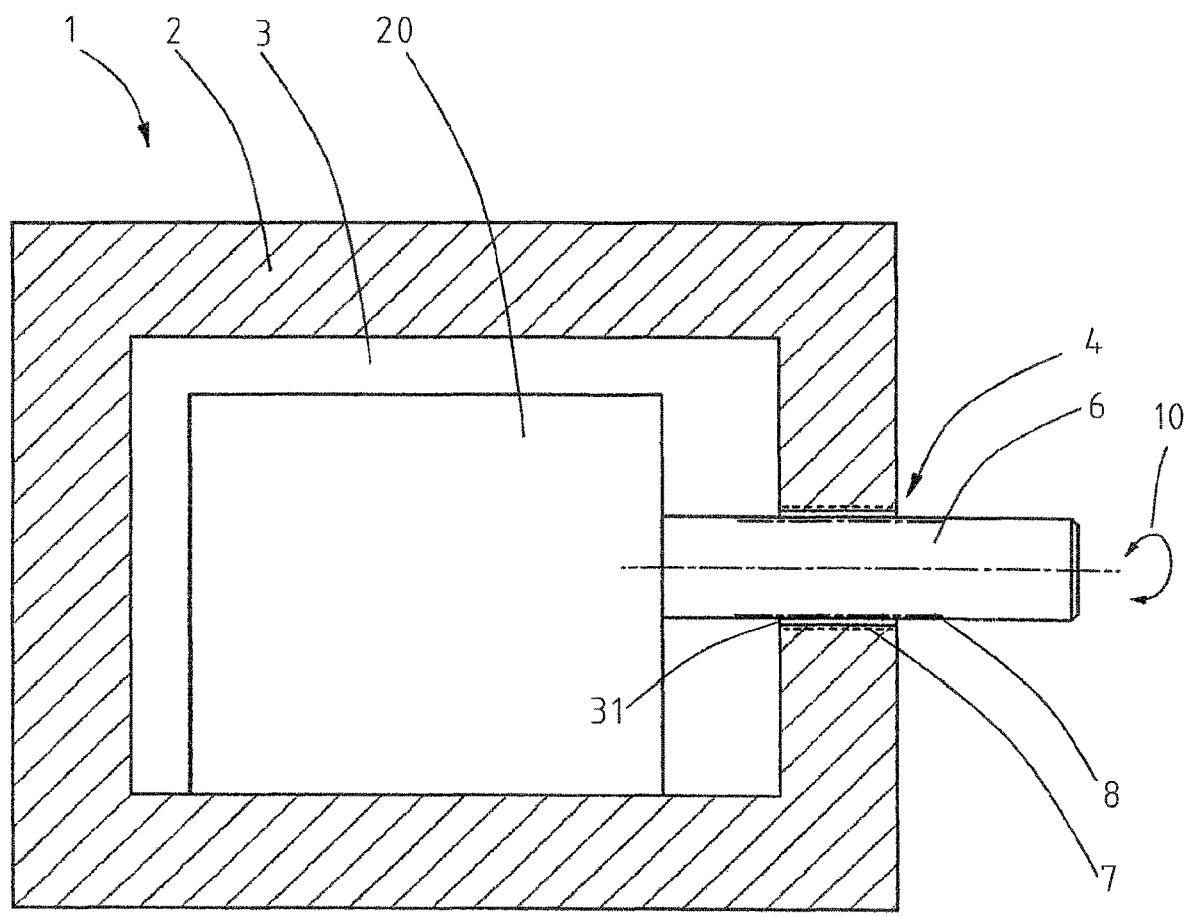
FIG. 7 illustrates a partial section of the device of FIG. 1 with a motor and a shaft as movable component.

FIG. 7 shows a partial section of a device (1) with a motor (20) and a shaft as movable component (6). Device (1) comprises a housing (2) with an interior (3) in which motor (20) is located. Shaft (6) of motor (20) protrudes outward through opening (4) of housing (2). Housing (2) and shaft (6) are provided with hydrophobic surfaces (7, 8) in the region of opening (4). Hydrophobic surfaces (7, 8) prevent a wetting of the surfaces forming gap (31) and thus prevent a penetration of fluids.

Figure 8:
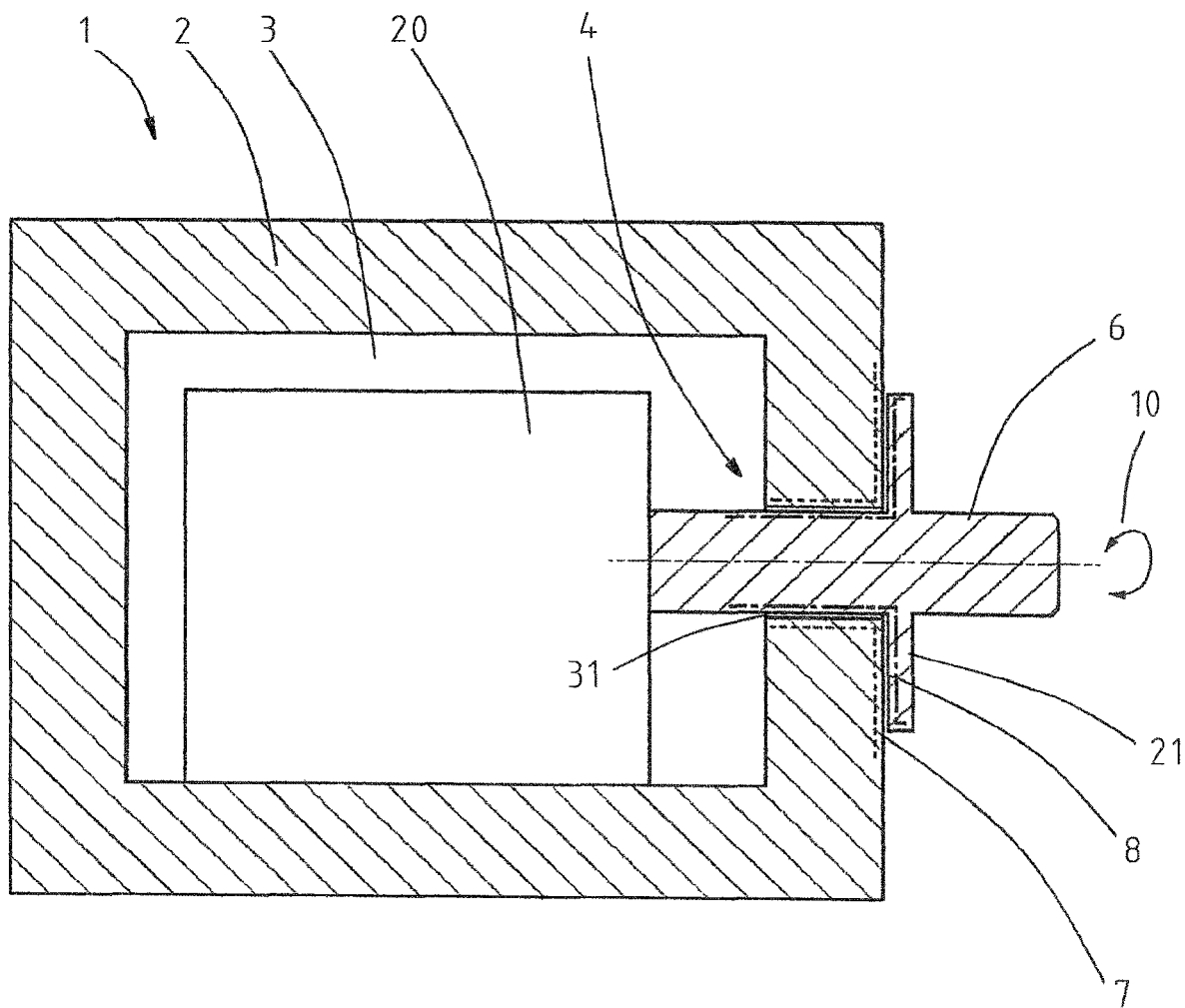
FIG. 8 illustrates a partial section of the device of FIG. 1 with a motor and a shaft as movable component which is provided with a centrifugal disk on the outside of housing.

FIG. 8 shows a partial section of a device (1) with a motor (20), the shaft of which, designed as movable component (6), is provided with a centrifugal disk (21) on the outside of housing (2). Centrifugal disk (21) amplifies the sealing effect of hydrophobic surfaces (7, 8). The inward-lying surfaces of housing (2), shaft (6), and centrifugal disk (21) delimiting gap (31) are designed as hydrophobic surfaces (7, 8) and prevent penetration by fluids. The outer, non-hydrophobically coated parts of centrifugal disk (21) hurl fluid droplets away from shaft (6) due to centrifugal force. Thus, the amount of fluid in the region of gap (31) is largely reduced. A sealing effect is thus ensured in harsh environmental conditions.

In devices (1) according to FIGS. 1 through 8, a non-contact barrier against the penetration of microorganisms is carried out at the same time. FIGS. 1 through 8 show antibacterial seals, as hydrophobic surfaces (7, 8) prevent the colonization of bacteria and microorganisms. This is important, in particular, for medical devices. By using an antiseptic barrier fluid (15) in FIG. 4 and FIG. 5, a migration of germs through barrier fluid (15) is prevented, in addition to gas penetration. Barrier fluid (15) blocks the air path, functions antiseptically, and is enclosed between hydrophobic surfaces (7, 8). Regardless of the effect of centripetal force, a leakproof barrier is created, which blocks a penetration of air with bacteria, germs, and microorganisms, and a penetration of dust through gap (31).

REFERENCE NUMERALS

1 Device
2 Housing
3 Interior
4 Opening
5 Stationary component
6 Movable component
7 Hydrophobic surface, housing
8 Hydrophobic surface, component
9 Linear movement direction
10 Direction of rotation
11 Scraper
14 Cavity
15 Barrier fluid 16 Barrier fluid surface
17 Direction of centripetal force
18 Electric switch mechanism
19 Electrical supply line
20 Motor
21 Centrifugal disk
30 Exterior
31 Gap
32 Component-side gap surface
33 Housing-side gap surface

The invention claimed is:

1. A device, comprising:
a housing comprising at least one opening;
a movable component closing the at least one opening of the housing up to a gap between the housing and the movable component forming a non-contact seal, the gap defining a housing-side gap surface and a component-side gap surface and the gap being free of any sealing element between the housing and the movable component and preventing penetration of fluids through the gap;
wherein one of the component-side gap surface and the housing-side gap surface is provided with a hydrophobic surface, and another of the component-side gap surface and the housing-side gap surface is provided with a non-hydrophobic surface.

2. The device according to claim 1, wherein the housing-side gap surface is covered by the hydrophobic surface.

3. The device according to claim 1, wherein the movable component is movable linearly and an axial length of the hydrophobic surface of the component-side gap surface is greater than an axial length of the gap in that the hydrophobic surface extends to each region of the component-side gap surface which delimits the gap during a linear displacement of the movable component.

4. The device according to claim 1, wherein a scraper with the hydrophobic surfaces is arranged around the movable component on a side of the housing.

5. The device according to claim 1, wherein an additional fluid barrier is provided for a gas-tight sealing of the housing, the additional fluid barrier comprises at least one receptacle in a cavity in at least one gap surface and a barrier fluid is retained in the cavity.

6. The device according to claim 5, wherein the barrier fluid is antiseptic.

7. The device according to claim 1, wherein an electric switching mechanism is provided in the housing and is connected to electrical connections and is connected to the movable component functioning as an actuating element, wherein openings for the electrical connections and for the movable component are provided in the housing, and wherein at least one of the gap surfaces of the gap between the connections and the housing has hydrophobic surfaces.

8. The device according to claim 1, wherein a motor is provided in the housing and is connected to the movable component designed as a shaft, wherein the at least one opening is provided in the housing for the movable component.

9. The device according to claim 8, wherein the movable component designed as the shaft is provided with a centrifugal disk out of the housing, wherein an inner surface of the centrifugal disk and/or an outer side of the housing in the region of the centrifugal disk have the hydrophobic surfaces.

10. The device according to claim 1, wherein additional openings are provided in the housing for a stationary component, wherein one of the surfaces forming the gap is provided with a hydrophobic surface.

11. The device according to claim 1, wherein the hydrophobic surface is provided with a hydrophobic coating or has a corresponding nanostructure.

12. A device, comprising:
a housing comprising at least one opening;
a movable component closing the at least one opening of the housing; and
a gap formed between the housing and the movable component and defining a housing-side gap surface and a component-side gap surface and the gap being free of any sealing element between the housing and the movable component and preventing penetration of fluids through the gap;
wherein one of the housing-side gap surface and the component-side gap surface is provided with a hydrophobic surface, and another of the component-side gap surface and the housing-side gap surface is provided with a non-hydrophobic surface; and
an electric switching mechanism is provided in the housing and is connected to electrical connections and is connected to the movable component functioning as an actuating element,
wherein openings for the electrical connections and for the movable component are provided in the housing, and wherein at least one of the gap surfaces of the gap between the connections and the housing has hydrophobic surfaces.

13. A device, comprising:
a housing comprising at least one opening;
a movable component closing the at least one opening of the housing; and
a gap formed between the housing and the movable component and defining a housing-side gap surface and a component-side gap surface and the gap being free of any sealing element between the housing and the movable component and preventing penetration of fluids through the gap;
wherein one of the housing-side gap surface and the component-side gap surface is provided with a hydrophobic surface, and another of the component-side gap surface and the housing-side gap surface is provided with a non-hydrophobic surface; and
a motor is provided in the housing and is connected to the movable component designed as a shaft, wherein the at least one opening is provided in the housing for the movable component.

14. A device, comprising:
a housing comprising at least one opening;
a movable component closing the at least one opening of the housing; and
a gap formed between the housing and the movable component and defining a housing-side gap surface and a component-side gap surface and the gap being free of any sealing element between the housing and the movable component and preventing penetration of fluids through the gap;
wherein one of the housing-side gap surface the component-side gap surface is provided with a hydrophobic surface, and another of the component-side gap surface and the housing-side gap surface is provided with a non-hydrophobic surface; and
wherein additional openings are provided in the housing for a stationary component, wherein one of the surfaces forming the gap is provided with a hydrophobic surface.

* * * * *